(12) United States Patent
Zhong

(10) Patent No.: US 6,184,260 B1
(45) Date of Patent: Feb. 6, 2001

(54) METHOD FOR MAKING NANOPOROUS SILICONE RESINS FROM ALKYLHYDRIDOSILOXANE RESINS

(75) Inventor: Bianxiao Zhong, Midland, MI (US)

(73) Assignee: Dow Corning Corporation, Midland, MI (US)

( * ) Notice: Under 35 U.S.C. 154(b), the term of this patent shall be extended for 0 days.

(21) Appl. No.: 09/596,012

(22) Filed: Jun. 16, 2000

Related U.S. Application Data

(62) Division of application No. 09/458,739, filed on Dec. 13, 1999.

(51) Int. Cl.$^7$ ....................................................... C08J 9/02
(52) U.S. Cl. ............................................. 521/77; 521/154
(58) Field of Search ........................................ 521/77, 154

(56) References Cited

U.S. PATENT DOCUMENTS

| | | | |
|---|---|---|---|
| 3,159,601 | 12/1964 | Ashby | 260/46.5 |
| 3,220,972 | 11/1965 | Lamoreaux | 260/46.5 |
| 3,296,291 | 1/1967 | Chalk et al. | 260/448.2 |
| 3,419,593 | 12/1968 | Willing | 260/448.2 |
| 3,516,946 | 6/1970 | Modic | 252/429 |
| 3,615,272 | 10/1971 | Collins et al. | 23/366 |
| 3,814,730 | 6/1974 | Karstedt | 260/46.5 |
| 3,928,629 | 12/1975 | Chandra et al. | 427/387 |
| 3,989,668 | 11/1976 | Lee et al. | 260/46.5 |
| 4,756,977 | 7/1988 | Haluska et al. | 428/704 |
| 5,010,159 | 4/1991 | Bank et al. | 528/23 |
| 5,036,117 | 7/1991 | Chung et al. | 522/172 |
| 5,063,267 | 11/1991 | Hanneman et al. | 524/284 |
| 5,494,859 | 2/1996 | Kapoor | 437/235 |
| 5,776,990 | 7/1998 | Hedrick et al. | 521/77 |

FOREIGN PATENT DOCUMENTS

| | | | |
|---|---|---|---|
| 10-287746 | 10/1998 | (JP) | C08G/77/04 |
| WO 98/47941 | 10/1998 | (WO) | C08G/77/08 |
| WO 98/47944 | 10/1998 | (WO) | C08G/77/12 |
| WO 98/47945 | 10/1998 | (WO) | C08G/77/12 |
| WO 98/49721 | 11/1998 | (WO) | H01L/21/316 |

*Primary Examiner*—Morton Foelak
(74) *Attorney, Agent, or Firm*—Rick D. Streu

(57) ABSTRACT

A method for preparing a nanoporous silicone resin which can be used to form low dielectric constant films useful for electrical insulating coatings on electronic devices comprising (A) contacting a hydridosilicon containing resin with a 1-alkene comprising about 8 to 28 carbon atoms in the presence of a platinum group metal-containing hydrosilation catalyst effecting formation of an alkylhydridosiloxane resin where at least 5 percent of silicon atoms are substituted with at least one group comprising about 8 to 28 carbon atoms and at least 45 percent of silicon atoms are substituted with at least one hydrogen atom and (B) heating the alkylhydridosiloxane resin of step (A) at a temperature sufficient to effect curing and thermolysis of alkyl groups comprising about 8 to 28 carbon atoms from the silicon atoms thereby forming a nanoporous silicone resin.

12 Claims, No Drawings

US 6,184,260 B1

METHOD FOR MAKING NANOPOROUS SILICONE RESINS FROM ALKYLHYDRIDOSILOXANE RESINS

This application is a divisional of U.S. patent application Ser. No. 09/458,739 filed Dec. 13, 1999, pending.

BACKGROUND OF INVENTION

The present invention relates generally to a method for making nanoporous silicone resins which are useful for forming low dielectric constant films. More specifically, the present invention in a preferred embodiment is a method for making a nanoporous silicone resin having a narrow pore size range by hydrosilating a hydridosilicon containing resin with a 1-alkene comprising about 8 to 28 carbon atoms to form an alkylhydridosiloxane resin, coating the alkylhydridosiloxane resin on a substrate, and heating the coated substrate to effect thermolysis of alkyl substituents comprising about 8 to 28 carbon atoms of the alkylhydridosiloxane resin to form a nanoporous silicone resin.

Semiconductor devices often have one or more arrays of patterned interconnect levels that serve to electrically couple the individual circuit elements forming an integrated circuit (IC). These interconnect levels are typically separated by an insulating or dielectric film. Previously, a silicon oxide film formed using chemical vapor deposition (CVD) or plasma enhanced techniques (PECVD) was the most commonly used material for such dielectric films. However, as the size of circuit elements and the spaces between such elements decreases, the relatively high dielectric constant of such silicon oxide films is inadequate to provide adequate electrical insulation.

In order to provide a lower dielectric constant than that of silicon oxide, dielectric films formed from siloxane-based resins have found use. An example of such films are those formed from poly(hydrogen)silsesquioxane resins as described for example in Collins et al., U.S. Pat. No 3,615,272 and Haluska et al. U.S. Pat. No. 4,756,977. While such films provide lower dielectric constants than CVD or PECVD silicon oxide films and also provide other benefits such as enhanced gap filling and surface planarization, typically the dielectric constants of such films are limited to approximately 3 or greater.

It is well known that the dielectric constant of the above discussed insulating films is an important factor where IC's with low power consumption, cross-talk, and signal delay are required. As IC dimensions continue to shrink, this factor increases in importance. As a result, siloxane based resin materials and methods for making such materials that can provide electrically insulating films with dielectric constants below 3 are desirable. In addition it is desirable to have siloxane-based resins and method for making such resins that provide low dielectric constant films which have a high resistance to cracking. Also, it is desirable for such siloxane-based resins to provide low dielectric constant films by standard processing techniques.

It is known that the dielectric constant of solid films decrease with a decrease in density of the film material. Therefore considerable work is being conducted to develop porous insulating films for use on semiconductor devices.

Kapoor, U.S. Pat. No. 5,494,859, describes a low dielectric constant insulating layer for an integrated circuit structure and a method of making the layer. A porous layer is formed by depositing on a structure a composite layer comprising an insulating matrix material and a material which can be converted to a gas upon subjection to a converting process. Release of the gas leaves behind a porous matrix of the insulating material which has a lower dielectric constant than the composite layer. The matrix forming material is typically silicon oxide and the material which can be converted to a gas upon subjection to a converting process is exemplified by carbon.

Hedrick et al., U.S. Pat. No. 5,776,990, describe an insulating foamed polymer having a pore size less than about 100 nm made from a copolymer comprising a matrix polymer and a thermally decomposable polymer by heating the copolymer above the decomposition temperature of the decomposable polymer. The copolymers described are organic polymers that do not contain silicon atoms.

Smith et al., WO 98/49721, describe a process for forming a nanoporous dielectric coating on a substrate. The process comprises the steps of blending an alkoxysilane with a solvent composition and optional water; depositing the mixture onto a substrate while evaporating at least a portion of the solvent; placing the substrate in a sealed chamber and evacuating the chamber to a pressure below atmospheric pressure; exposing the substrate to water vapor at a pressure below atmospheric pressure and then exposing the substrate to base vapor.

Mikoshiba et al., Japanese Laid-Open Patent (HEI) 10-287746, describe the preparation of porous films from siloxane-based resins having organic substituents which are oxidized at a temperature of 250° C. or higher. The useful organic substituents which can be oxidized at a temperature of 250° C. or higher given in this document include substituted and unsubstituted groups as exemplified by 3,3,3-trifluoropropyl, β-phenethyl group, t-butyl group, 2-cyanoethyl group, benzyl group, and vinyl group.

Mikoskiba et al., *J Mat. Chem.*, 1999, 9, 591–598, report a method to fabricate angstrom size pores in poly (methylsilsesquioxane)films in order to decrease the density and the dielectric constant of the films. Copolymers bearing methyl(trisiloxysilyl) units and alkyl(trisiloxysilyl) units are spin-coated on to a substrate and heated at 250° C. to provide rigid siloxane matrices. The films are then heated at 450° C. to 500° C. to remove thermally labile groups and holes are left corresponding to the size of the substituents. Trifluoropropyl, cyanoethyl, phenylethyl, and propyl groups were investigated as the thermally labile substituents.

Hacker et al., WO 98/47941 Publication, describes a process for preparing organohydridosiloxane resins.

Hacker et al., WO 98/47944 Publication "'944 Pub.", describes an organohydridosiloxane polymer having a cage conformation, at least approximately 40 mole percent carbon containing substituents and a dielectric constant of less than about 2.7. Hacker et al., '944 Pub., teach the organic substituent of the organohydridosiloxane can be a normal or branched alkyl comprising 1 to 20 carbon atoms. In the examples Hacker et al, '944 Pub., demonstrate that the organic substituent can be methyl, phenyl, benzyl, tert-butyl, and chloromethyl and that organohydridosiloxane polymers containing such substituents can be heated at temperatures ranging from 380° C. to 450° C. to provide cured resins having dielectric constants ranging from 2.43 to 2.66.

Hacker et al., WO 98/47945 Publication "'945 Pub.", teach organohydridosiloxane polymer having between approximately 0.1 to 40 mole percent carbon-containing substituents, and a dielectric constant of less than about 3.0. Hacker et al., '945 Pub., teach that the organic substituent of the polymer can be for example normal and branched alkyls. In the examples, Hacker et al., '945 Pub., demonstrate that the organic substituents can be methyl, ethyl, propyl, n-butyl, cyclohexyl, phenyl, t-butyl, and trifluoropropyl. Hacker et al., '945 Pub., demonstrate that organohydridosiloxane containing the described organic substituents can be cured by heating at temperatures ranging from 380° C. to 425° C., and that such cured materials can have a dielectric constant ranging from 2.82 to 3.09.

It is clear from the examples provided in the above referenced Hacker et al. documents that Hacker et al. did not appreciate the improvement in dielectric constants that could be achieved by hydrosilating hydridosiloxane resins with 1-alkenes comprising about 8 to 28 carbon atoms to form alkylhydridosiloxane resins and subsequently curing the resin and thermolysing the alkyl substituents comprising about 8 to 28 carbon atoms of the alkylhydridosiloxane resins to form nanoporous siloxane resins. Generally, the organic substituents of the organohydridosiloxane resins used in the examples of Hacker et al. were too small to provide the amount of porosity required for optimal dielectric constants for the cured resins.

SUMMARY OF INVENTION

The present invention is a method for preparing a nanoporous silicone resin which can be used to form low dielectric constant films useful for electrical insulating coatings on electronic devices. The method comprises (A) contacting a hydridosilicon containing resin with a 1-alkene comprising about 8 to 28 carbon atoms in the presence of a platinum group metal-containing hydrosilation catalyst effecting formation of an alkylhydridosiloxane resin where at least 5 percent of silicon atoms are substituted with at least one alkyl group comprising about 8 to 28 carbon atoms and at least 45 percent of silicon atoms are substituted with at least one hydrogen atom and (B) heating the alkylhydridosiloxane resin of step (A) at a temperature sufficient to effect thermolysis of alkyl groups comprising about 8 to 28 carbon atoms of the alkylhydridosiloxane thereby forming a nanoporous silicone resin.

DESCRIPTION OF INVENTION

The present invention is a method for preparing a nanoporous silicone resin which can be used to form low dielectric constant films useful for electrical insulating coatings on electronic devices. The method comprises (A) contacting a hydridosilicon containing resin with a 1-alkene comprising about 8 to 28 carbon atoms in the presence of a platinum group metal-containing hydrosilation catalyst effecting formation of an alkylhydridosiloxane resin where at least 5 percent of silicon atoms are substituted with at least one alkyl group comprising about 8 to 28 carbon atoms and at least 45 percent of silicon atoms are substituted with at least one hydrogen atom and (B) heating the alkylhydridosiloxane resin of step (A) at a temperature sufficient to effect thermolysis of alkyl substituents of the alkylhydridosiloxane resin thereby forming a nanoporous silicone resin.

The hydridosilicon containing resin can be any of those known in the art where at least 50 percent of the silicon atoms have a hydrogen substitution and as such can be homopolymers or copolymers. The following nonlimiting list of possible hydrolysates and co-hydrolysates are, however, specifically contemplated:

$(HSiO_{3/2})_n$,
$(H_2SiO)_m$,
$(HSiO_{3/2})_x(R^1SiO_{3/2})_y$,
$(HSiO_{3/2})_x(R^1R^2SiO)_y$,
$(HSiO_{3/2})_x(R^1R^2SiO)_y(SiO_2)_z$, and
$(HSiO_{3/2})_x(H_2SiO)_y$;

where $R^1$ is a substituent which is not removed by heating at a temperature up to about 600° C., $R^2$ is either $R^1$ or hydrogen, $n \geq 2$, $m \geq 3$, the mole fractions of x, y, and z must total 1 in each of the copolymers, and x is at least 50 percent of the sum of x, y, and z. Examples of $R^1$ include methyl, ethyl, and phenyl. Hydrosilicon containing resins useful in the present process and their methods for preparation can be those described, for example in Collins et al. U.S. Pat. No. 3,615,272; Hanneman et al., U.S. Pat. No. 5,063,267; and Bank et al., U.S. Pat. No. 5,010,159; all of which are hereby incorporated by reference. Preferred is when the hydridosilicon containing resin is selected from the group of hydridosiloxane resins described by formulas $(HSiO_{3/2})_n$, $(H_2SiO)_m$, and $(HSiO_{3/2})_x(H_2SiO)_y$; where n, m, x, and y are as described above. More preferred is when n is an integer within a range of about 100 to 1000, m is an integer within a range of about 100 to 1000, and x and y are each one or greater and x+y is within a range of 100 to 1000. Most preferred is when the hydridosilicon containing resin is a hydridosiloxane resin described by formula $(HSiO_{3/2})_n$, where n is as described above and n is preferably within a range of about 100 to 1000.

It is preferred that the hydridosilicon containing resin be diluted in an organic solvent that is not detrimental to the hydrosilation reaction. The organic solvent can be generally any non-aromatic organic solvent that does not contain carbon-carbon unsaturated bonds and aromatic solvents. The organic solvent can be substituted or unsubstituted. Examples of useful organic solvents include alkanes such as dodecane, n-pentane, hexane, n-heptane, and isooctane; cycloalkanes such as cyclopentane and cyclohexane; aromatics such as benzene, toluene, xylene, and mesitylene; ketones such as methylisobutylketone; halogen substituted alkanes such as trichloroethane; and halogen substituted aromatics such as bromobenzene and chlorobenzene. Additionally, combinations of the above organic solvents may be used together as cosolvents for the hydridosilicon containing resin. The preferred organic solvents are aromatic compounds because of their high volatility, with toluene and mesitylene being most preferred because of their safety profile.

It is preferred that the hydridosilicon containing resin be diluted in the organic solvent at a weight percent within a range of about 5 to 60 weight percent of the solution comprising the resin and organic solvent. More preferred is when the hydridosilicon containing resin is diluted in the organic solvent at a weight percent within a range of about 10 to 30 weight percent on the same basis.

In the present method the hydridosilicon containing resin is contacted with a 1-alkene comprising about 8 to 28 carbon atoms. The 1-alkene can be straight chained or branched and may be substituted or unsubstituted. Substituted 1-alkenes include those for example having hydroxy substitution, 1-alkenes having acyloxy substitution such as described by formula $CH_2=CH(CH_2)_aOC(O)(CH_2)_bCH_3$, alkoxycarbonyl substitution such as described by formula $CH_2=CH(CH_2)_aC(O)O(CH_2)_bCH_3$, alkoxy substitution such as described by formula $CH_2=CH(CH_2)_aO(CH_2)_bCH_3$, carbonyl substitution such as described by formula $CH_2=CH(CH_2)_a(O)(CH_2)_bCH_3$, and cycloalkyl substitution such as described by formula $CH_2=CH(CH_2)_aR^3$ where $R^3$ is a cycloalkyl group comprising about 5 to 10 carbon atoms, $a \geq 0$, $b \geq 0$, and the total number of carbon atoms in the substituted 1-alkene is within a range of about 8 to 28.

It is preferred that the 1-alkene be a branched 1-alkene since the present inventors have discovered that during thermolysis the resulting branched alkyl groups substituted on the alkylhydridosiloxane resin release lower molecular weight hydrocarbon components than then linear alkyl substitutions have a comparable number of carbon atoms and thus the thermolysis products are more easily removed from the cured nanoporous siloxane resins. Examples of 1-alkenes useful in the present process include 1-octene, 1-decene, 1-dodecene, 1-eicosene, 1-pentatricontene, and 3,7,11,15-tetramethyl-1-hexadecen-3-ol. It is preferred that the 1-alkene be an unsubstituted straight or branched chain molecule comprising 12 to about 20 carbon atoms or 3,7,11,15-tetramethyl-1-hexadecen-3-ol (isophytol), with isophytol being most preferred. Preferred is when the 1-alkene is selected from the group consisting of 1-eicosene, 1-dodecene, and 3,7,11,15-tetramethyl-1-hexadecen-3-ol.

It is necessary in the present method that after the hydrosilation reaction at least about 45 percent of the silicon atoms remain substituted with at least one hydrogen atom to retain curing ability of the silicon resin. Generally, this amount of hydrogen atoms bonded to silicon atoms in the resin can be achieved by adding an amount of 1-alkene comprising about 8 to 28 carbon atoms to the present method such that the mole ratio of the 1-alkene to silicon-bonded hydrogen in the hydridosilicon containing resin is within a range of about 0.05:1 to 0.7:1, with a range of about 0.1:1 to 0.5:1 being preferred.

The present method requires the presence of a platinum group metal-containing hydrosilation catalyst. The platinum group metal-containing hydrosilation catalyst can be any of those known in the art to effect a hydrosilation reaction between a silicon-bonded hydrogen atom and an unsaturated carbon-carbon bond. By "platinum group metal" it is meant ruthenium, rhodium, palladium, osmium, iridium, and platinum, with platinum being preferred. Examples of platinum group metal-contain catalysts which may be useful in the present invention are described for example in Willing, U.S. Pat. No. 3,419,593; Lee et al., U.S. Pat. No. 3,989,668; Chang et al., U.S. Pat. No 5,036,117; Ashby, U.S. Pat. No. 3,159,601; Lamoreaux, U.S. Pat. No. 3,220,972; Chalk et al., U.S. Pat. No. 3,296,291; Modic U.S. Pat. No. 3,516,946; Karstedt, U.S. Pat. No. 3,814,730; and Chandra et al., U.S. Pat. No. 3,928,629 all of which are hereby incorporated by reference to show platinum group metal containing catalysts and methods for their preparation which may be useful in the present method. A preferred platinum group metal-containing catalyst is a complex of platinum with 1,3-diethenyl-1,1,3,3-tetramethyldisiloxane.

The amount of platinum group metal-containing catalyst useful in the present method is not narrowly limited as long as there is a sufficient amount present to accelerate a reaction between silicon-bonded hydrogen atoms and the 1-alkene comprising about 8 to 28 carbon atoms. The appropriate amount of the platinum group metal-containing catalyst will depend upon the particular catalyst used. In general as low as about 0.001 part by weight of platinum group metal for every million parts by weight of components present in Step (A), including any solvent when present, may be useful. Preferably the amount of platinum group metal is at least about 1 ppm on the same basis, with about 10 to 100 ppm being more preferred, and 20 to 60 ppm being most preferred.

The temperature at which the hydridosilicon containing resin is contacted with the 1-alkene comprising about 8 to 28 carbons is not critical as long as it does not effect significant gelation or curing of the alkylhydridosiloxane resin product. Generally the temperature can be within a range of about 20° C. to 150° C., with a temperature within a range of about 50° C. to 100° C. being preferred.

In step (A) of the present method an alkylhydridosiloxane resin is formed where at least 5 percent of the silicon atoms are substituted with at least one alkyl group comprising about 8 to 28 carbon atoms and at least 45 percent of silicon atoms are substituted with at least one hydrogen atom. Preferred is where about 10 to 25 percent of the silicon atoms are substituted with at least one alkyl group comprising about 8 to 28 carbon atoms and at least 70 percent of the silicon atoms are substituted with at least one hydrogen atom.

In step (B) of the present method the alkylhydridosiloxane resin of step (A) is heated at a temperature sufficient to effect thermolysis of alkyl groups comprising about 8 to 28 carbon atoms from the silicon atoms. The heating may be conducted as a single-step process or as a two-step process. In the two-step process the alkylhydridosiloxane resin is first heated at a temperature sufficient to effect curing without significant thermolysis of the alkyl groups comprising about 8 to 28 carbon atoms from the silicon atoms. Generally this temperature can be in a range of from about 20° C. to 350° C. Then, the cured silicone resin is further heated at a temperature within a range of greater than 350° C. up to the lessor of the decomposition temperature of the silicon resin polymer backbone or $R^1$ substituents (as described above) on the silicon atoms to effect thermolysis of the alkyl groups comprising about 8 to 28 carbon atoms from the silicon atoms. Generally, it is preferred that the thermolysis step be conducted at a temperature in a range of greater than 350° C. to about 600° C., with a temperature in a range of about 400° C. to 550° C. being most preferred. In the single-step heating process the curing of the silicone resin and thermolysis of the alkyl groups comprising about 8 to 28 carbon atoms are effected simultaneously by heating the alkylhydridosiloxane resin to a temperature within a range of greater than 350° C. up to the lessor of the decomposition temperature of the silicone resin polymer backbone or $R^1$ substituents on the silicon atoms. Generally, it is preferred that the single-step method of heating be conducted at a temperature in a range of greater than 350° C. to about 600° C., with a temperature in a range of about 400° C. to 550° C. being most preferred.

In the present method it is preferred that the heating of step (B) be conducted in an inert atmosphere. The inert atmosphere is useful because the presence of oxygen may oxidize Si-H bonds and cause the formation of silanol groups resulting in an increased dielectric constant (DK) for the resin. The inert atmosphere can be any of those known in the art, for example argon, helium, or nitrogen.

The thermolysis of the alkyl groups comprising about 8 to 28 carbon atoms results in the formation of a nanoporous silicone resin. The nanoporous silicone resins formed by the present method are particularly useful as low dielectric films on electronic devices such is integrated chips. The silicon resins of the invention can generally be applied to the surface of electronic devices in the form of a dilute solvent solution by methods such as spin coating, dip coating, spray coating, or flow coating. The solvent is then allowed to evaporate by drying to form a homogeneous resin which is then heated as described above to cure and provide for a nanoporous silicone resin having a dielectric constant less than about preferably 2.5. The useful solvents can be the same as those described above for use in the hydrosilation step.

The silicone resins made by the present method are nanoporous. By the term "nanoporous" it is meant a silicone resin have a median pore diameter less than about 20 nm. A preferred embodiment of the present invention is an electronic substrate having a nanoporous coating of the silicone resin. In the preferred embodiment of the invention, the nanoporous silicone resin coating preferably has a median pore diameter within a range of about 0.3 nm to 2 nm. Such nanoporous silicone resins may also be made in particulate form by standard methods such as spray drying and heating as described above to make nanoporous and used in such applications as packing in chromatography columns and other such applications where porous materials are used.

The following examples are provide to illustrate the present invention. These examples are not intend to limit the scope of the claims herein.

EXAMPLE 1

This example illustrates the treatment of a hydridosilicon containing resin with a 1-alkene in the presence of a platinum catalyst. The 1-alkene was either 1-octadecene or 1-dodecene as described in Table 1. The hydridosilicon containing resin was a poly(hydrogen)silsesquioxane resin powder with a weight average molecular weight of 70,000. The weight parts of 1-alkene and toluene solvent per part of the poly(hydrogen)silsesquioxane resin, and mole ratios of 1-alkene/Si atoms in the resin are listed in Table 1. The toluene solution of the resin was reacted with the 1-alkene at 110° C. in the presence of $1.2 \times 10^{-5}$ weight part of platinum in the form of a complex with 1,3-diethenyl-1,1,3,3-tetramethyldisiloxane for 2 hours. The mole percents of Si-H that reacted with the 1-alkene were measured by solution FTIR using a Perkin Elmer 1600 FTIR made by the Perkin-Elmer Corporation, Norwalk, Conn., and the results are listed in Table 1.

TABLE 1

Treatment of Poly(hydrogen)silsesquioxane Resin With 1-Alkene

| Sample No. | Type of 1-alkene | Wt. parts of 1-alkene | Wt. parts of toluene | Mole ratio 1-alkene/Si | Mole % of Si—H reacted |
| --- | --- | --- | --- | --- | --- |
| 1-1 | 1-octadecene | 1.60 | 2.22 | 0.33 | 31 |
| 1-2 | 1-octadecene | 1.10 | 2.72 | 0.23 | 21 |
| 1-3 | 1-octadecene | 0.85 | 2.97 | 0.18 | 20 |
| 1-4 | 1-octadecene | 0.60 | 3.22 | 0.12 | 14 |
| 1-5 | 1-octadecene | 0.35 | 3.47 | 0.07 | 6 |
| 1-6 | 1-octadecene | 0.15 | 3.67 | 0.03 | 3 |
| 1-7 | 1-dodecene | 1.10 | 2.72 | 0.35 | 29 |
| 1-8 | 1-dodecene | 0.85 | 2.97 | 0.27 | 28 |
| 1-9 | 1-dodecene | 0.60 | 3.22 | 0.19 | 21 |
| 1-10 | 1-dodecene | 0.35 | 3.47 | 0.11 | 12 |
| 1-11 | 1-dodecene | 0.15 | 3.67 | 0.05 | 5 |

EXAMPLE 2

This example consists of three steps. In Step 1, a poly(hydrogen)-silsesquioxane resin was treated with various amounts of 1-octadecene under the same conditions as those for samples 1-1 to 1-6 in Example 1. Sample 2-7 is the poly(hydrogen)-silsesquioxane resin solution in toluene (4.72 parts of toluene per part of resin) not reacted with 1-octadecene. In Step 2, a 2 g sample of each resin solution prepared in Step 1 was placed into a ceramic crucible, heated at 350° C. in nitrogen for 0.5 hour, and then heated at 500° C. in nitrogen for 1 hour. The resulting solids were tested for nitrogen adsorption at −196° C. using a Micromeritics ASAP 2000 Accelerated Surface Area and Porosimetry System. Porosity for each sample was calculated from its total pore volume obtained from the adsorption analysis using a density of 1.5 g/cc for the untreated resin solid. In Step 3, a sample of each resin solution prepared in Step 1 was diluted with toluene to 17 weight percent, and a thin film was prepared from each diluted resin solution by spin coating on a silicon wafer. The coated wafers were heated in a nitrogen atmosphere at 450° C. for 20 minutes, and their dielectric constants (DK) were measured. Table 2 lists weight ratios of 1-octadecene/(1-octadecene+resin) in each resin solution, porosity obtained in Step 2, and dielectric constants obtained in Step 3.

TABLE 2

Effects of 1-Octadecene Concentration on Porosity and Dielectric Constants

| Sample No. | Weight ratio of 1-octadecene/(1-octadecene + resin) | Porosity % | DK |
| --- | --- | --- | --- |
| 2-1 | 61.5 | 27.1 | 2.1 |
| 2-2 | 52.4 | 27.9 | 2.2 |
| 2-3 | 46.0 | 24.3 | 2.2 |
| 2-4 | 37.5 | 23.6 | 2.1 |
| 2-5 | 25.9 | 18.8 | 2.5 |
| 2-6 | 13.0 | 0.2 | 2.7 |
| 2-7 | 0 | 0 | 3.0 |

EXAMPLE 3

Samples 3-1 to 3-9 were prepared and tested according to the procedures described in Example 2, except that the weight parts of all 1-alkenes (linear alpha alkenes described by general formula $C_yH_{2y}$) were fixed at 0.84 weight part per weight part of the resin, and those of toluene were 3 weight parts per weight part of the resin. The values for subscript y are provided in Table 3. Median pore diameters for cured solids from samples 3-1 to 3-6 were calculated by H-K analysis (Horvath, J. Chem. Eng. Jpn., 1983, Vol. 16, page 476) of the nitrogen adsorption data. Sample 3-1 resulted in a cracked film, so no dielectric constant was measured for it.

TABLE 3

Porosity and dielectric constant data for cured resins treated with different alkenes.

| Sample # | 1-Alkene y = | BET surface area, m²/g | Porosity % | Median pore diameter, nm | Crack-free film | DK |
|---|---|---|---|---|---|---|
| 3-1 | 30 | 892 | 37.8 | 0.78 | N | NA |
| 3-2 | 20 | 620 | 30.5 | 0.62 | Y | 2.0 |
| 3-3 | 18 | 570 | 28.5 | 0.63 | Y | 2.1 |
| 3-4 | 16 | 603 | 29.7 | 0.62 | Y | 2.0 |
| 3-5 | 14 | 546 | 27.6 | 0.62 | Y | 2.1 |
| 3-6 | 12 | 536 | 27.2 | 0.61 | Y | 2.1 |
| 3-7 | 10 | 453 | 23.1 | NA | Y | 2.2 |
| 3-8 | 8 | 422 | 21.9 | NA | Y | 2.3 |
| 3-9 | 7 | 391 | 20.4 | NA | Y | 2.6 |

EXAMPLE 4

Samples 4-1, 4-2, and 4-3 were prepared and tested according to procedures described in Example 3, except that the 1-alkenes were branched and/or substituted. The results are reported in Table 4.

TABLE 4

Porosity and Dielectric Data For Resins Treated With Substituted 1-Alkenes.

| Sample No. | 1-Alkene type | BET surface area, m²/g | Porosity % | Median pore diameter, nm | Crack-free film | DK |
|---|---|---|---|---|---|---|
| 4-1 | isophytol (3,7,11,15-tetramethyl 1-hexadecen-3-ol) | 751 | 33.1 | 0.65 | Y | 1.9 |
| 4-2 | allyl heptanoate | 478 | 25.0 | 0.57 | Y | 2.5 |
| 4-3 | allyl cyclohexane-propioate | 451 | 24.0 | 0.56 | Y | 2.3 |

SAMPLE 5

Sample 5-1 was prepared under the same conditions as those for sample 3-2 in Step 1 of Example 3, sample 5-2 was prepared under the same conditions as those for sample 3-6 in Step 1 of Example 3, and sample 5-3 was prepared under the same conditions as those for sample 4-1 in Step 1 of Example 4. A sample of 5 g of each of the toluene solution of the resins was then heated in a crucible at 300° C. for 1 hour in nitrogen to yield a solid resin. Then, each solid resin was heated in a quartz tube at 450° C. for 1 hour under a nitrogen flow and the released volatiles removed in the nitrogen were collected with a cold trap at −196° C. The collected volatiles were analyzed by GC. Volatiles from sample 5-1 consisted mainly of hydrocarbons with 19, 18, 17, 16, 15, 14, 13, 12, 11, 10, 9, 8, 7, and 6 carbon atoms, those from sample 5-2 consisted mainly of hydrocarbons with 11, 10, 9, 8, 7, and 6 carbon atoms, and those from sample 5-3 mainly consisted of hydrocarbons with 9, 8, 7, and 6 carbon atoms

What is claimed is:

1. A method for preparing a nanoporous silicone resin comprising the steps of
   (A) contacting a hydridosilicon containing resin with a 1-alkene comprising about 8 to 28 carbon atoms in the presence of a platinum group metal-containing hydrosilation catalyst effecting formation of an alkylhydridosiloxane resin where at least 5 percent of silicon atoms are substituted with at least one alkyl group comprising about 8 to 28 carbon atoms and at least 45 percent of silicon atoms are substituted with at least one hydrogen atom and
   (B) heating the alkylhydridosiloxane resin of step (A) at a temperature sufficient to effect thermolysis of alkyl substituents comprising about 8 to 28 carbon atoms of the alkylhydridosiloxane resin thereby forming a nanoporous silicone resin.

2. A method according to claim 1 where the hydridosilicon containing resin is selected from the group of hydridosiloxane resins described by formulas $(HSiO_{3/2})_n$, $(H_2SiO)_m$, and $(HSiO_{3/2})_x(H_2SiO)_y$, where n is within a range of about 100 to 1000, m is within a range of about 100 to 1000, x and y are each an integer of one or greater and x+y is within a range of about 100 to 1000.

3. A method according to claim 1 where the hydridosilicon containing resin is described by formula $(HSiO_{3/2})_n$, where n is within a range of about 100 to 1000.

4. A method according to claim 1, where the 1-alkene is a branched 1-alkene comprising about 8 to 28 carbon atoms.

5. A method according to claim 1, where the 1-alkene is selected from the group consisting of 1-dodecene, 1-ecicosene and 3,7,11,15-tetramethyl-1-hexadecen-3-ol.

6. A method according to claim 1, where the mole ratio of the 1-alkene to silicon-bonded hydrogen atoms in the hydridosilicon containing resin is within a range of about 0.05:1 to 0.7:1.

7. A method according to claim 1, where the mole ratio of the 1-alkene to silicon-bonded hydrogen atoms in the hydridosilicon containing resin is within a range of about 0.1 to 0.5:1.

8. A method according to claim 1, where about 10 to 25 percent of the silicon atoms of the alkylhydridosiloxane resin are substituted with at least one alkyl group comprising about 8 to 28 carbon atoms and at least 70 percent of the silicon atoms are substituted with at least one hydrogen atom.

9. A method according to claim 1, where the heating of step (B) is conducted in an inert atmosphere.

10. A method according to claim 1, where the thermolysis of alkyl substituents comprising about 8 to 28 carbon atoms is conducted at a temperature within a range of greater than 350° C. to about 600° C.

11. A method according to claim 1, where the thermolysis of alkyl substituents comprising about 8 to 28 carbon atoms is conducted at a temperature within a range of 400° C. to 550° C.

12. A nanoporous silicon resin prepared by the method of claim 1.

* * * * *